(12) United States Patent
Han et al.

(10) Patent No.: US 10,751,953 B2
(45) Date of Patent: Aug. 25, 2020

(54) IMPRINT MASTER TEMPLATE AND METHOD OF MANUFACTURING THE SAME

(71) Applicant: Samsung Display Co., Ltd., Yongin-si (KR)

(72) Inventors: Kang Soo Han, Seoul (KR); Moonjung An, Hwaseong-si (KR); Gugrae Jo, Asan-si (KR); Hyungbin Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 505 days.

(21) Appl. No.: 15/469,946

(22) Filed: Mar. 27, 2017

(65) Prior Publication Data

US 2018/0046075 A1    Feb. 15, 2018

(30) Foreign Application Priority Data

Aug. 9, 2016    (KR) .................... 10-2016-0101479

(51) Int. Cl.
*B29C 69/00*     (2006.01)
*G03F 7/00*      (2006.01)
(Continued)

(52) U.S. Cl.
CPC ........ *B29C 69/001* (2013.01); *B29C 33/3842* (2013.01); *B29C 59/02* (2013.01);
(Continued)

(58) Field of Classification Search
None
See application file for complete search history.

(56) References Cited

U.S. PATENT DOCUMENTS

2015/0108000 A1* 4/2015 Lee .................... B23P 15/24
                                                    205/70
2015/0290847 A1  10/2015 Misawa et al.
(Continued)

FOREIGN PATENT DOCUMENTS

KR    10-2015-0088823    8/2015
KR    10-2015-0112945    10/2015
KR    10-2016-0024410    3/2016

OTHER PUBLICATIONS

"4.7.2 Simple Bosch Process Simulation", http://www.iue.tuwien.ac.at/phd/ertl/node68.html, 2 pages.

*Primary Examiner* — Michael P. Rodriguez
(74) *Attorney, Agent, or Firm* — H.C. Park & Associates, PLC

(57) ABSTRACT

A method of manufacturing an imprint master template including forming a cutting line guide at an edge of a first fine pattern unit having an upper surface on which a fine pattern is formed; cutting a wafer substrate by a cleaving process along the cutting line guide so that a cutting surface is formed, the cutting surface having a preliminary second surface where the cutting line guide was formed and a first surface which is formed by the cleaving process; polishing the preliminary second surface to form a second surface which is inclined at a predetermined angle with respect to the first surface; and bonding the first fine pattern unit and the second fine pattern unit to each other with the first surface of the first fine pattern unit facing the first surface of the second fine pattern unit.

10 Claims, 9 Drawing Sheets

(51) Int. Cl.
*B29C 59/02* (2006.01)
*B29C 33/38* (2006.01)

(52) U.S. Cl.
CPC ...... *G03F 7/0002* (2013.01); *B29C 2059/027* (2013.01); *B29C 2793/0027* (2013.01)

(56) References Cited

U.S. PATENT DOCUMENTS

2015/0306792 A1 10/2015 Miyazawa
2016/0054498 A1 2/2016 Chung et al.

* cited by examiner

IMPRINT MASTER TEMPLATE AND METHOD OF MANUFACTURING THE SAME

CROSS-REFERENCE TO RELATED APPLICATION

This application claims priority from and the benefit of Korean Patent Application No. 10-2016-0101479, filed on Aug. 9, 2016, which is hereby incorporated by reference for all purposes as if fully set forth herein.

BACKGROUND

Field

Exemplary embodiments relate to an imprint master template and a method of manufacturing the imprint master template. More particularly, exemplary embodiments relate to an imprint master template for forming large area imprint resist pattern and a method of manufacturing the imprint master template.

Discussion of the Background

Recently, a display apparatus having light weight and small size has been manufactured. A cathode ray tube (CRT) display apparatus has been used in the past due to a performance and a competitive price. However, the CRT display apparatus suffers from several drawbacks, including large size and lack of portability. Therefore, various display apparatuses, such as a plasma display apparatus, a liquid crystal display apparatus, and an organic light emitting display apparatus, have been highly regarded due to small size, light weight, and low-power-consumption.

The liquid crystal display apparatus applies a voltage to a specific molecular arrangement configured to change the molecular arrangement. The liquid crystal display apparatus displays an image using changes of an optical property (for example, birefringence, rotatory polarization, dichroism, light scattering, etc.) of a liquid crystal cell according to changes of the molecular arrangement.

The liquid crystal display apparatus includes a polarizer to control molecular arrangement of liquid crystal, a display panel, an optical sheet, and a backlight assembly. Recently, the polarizer has been formed inside of the display panel (an "in-cell" polarizer). For example, a wire grid polarizer may be used. The wire grid polarizer may be formed by an imprint lithography process. However, a size of the master template for the imprint lithography process is limited, so that it becomes difficult to manufacture a large size panel.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an imprint master template for forming large area imprint resist pattern.

Exemplary embodiments also provide a method of manufacturing the imprint master template.

Additional aspects will be set forth in the detailed description which follows, and, in part, will be apparent from the disclosure, or may be learned by practice of the inventive concept.

An exemplary embodiment discloses an imprint master template including a first fine pattern unit having an upper surface on which a fine pattern is formed, a second fine pattern unit disposed adjacent to the first fine pattern unit and having an upper surface on which a fine pattern is formed, and a supporting part configured to support the first fine pattern unit and the second fine pattern unit. A side surface of the first fine pattern unit faces a side surface of the second fine pattern unit. The side surface of the first fine pattern unit includes a first surface which is perpendicular to the upper surface and a second surface which is inclined at a predetermined angle with respect to the first surface. The side surface of the second fine pattern unit includes a first surface which is perpendicular to the upper surface and a second surface which is inclined at a predetermined angle with respect to the first surface.

An exemplary embodiment also discloses a method of manufacturing an imprint master template including forming a first cutting line guide at an edge of a first fine pattern unit having an upper surface on which a first fine pattern is formed; forming a second cutting line guide at an edge of a second fine pattern unit having an upper surface on which a second fine pattern is formed; cutting a wafer substrate by a cleaving process along the first and second cutting line guides, so that a cutting surface is formed on each of the first and second fine pattern units, the cutting surface having a preliminary second surface where each of the first and second cutting line guides were formed and a first surface which is formed by the cleaving process; polishing the preliminary second surface to form a second surface which is inclined at a predetermined angle with respect to the first surface; bonding the first fine pattern unit and the second fine pattern unit to each other with the first surface of the first fine pattern unit facing the first surface of the second fine pattern unit; and forming a supporting part which supports the first fine pattern unit and the second fine pattern unit.

According to exemplary embodiments, the imprint master template includes the first fine pattern unit on which the first fine pattern is formed, the second fine pattern unit disposed adjacent to the first fine pattern unit and on which the second fine pattern is formed, and a supporting part for supporting the first fine pattern unit and the second fine pattern unit. The side surface of the first fine pattern unit faces the side surface of the second fine pattern unit, and the side surface of the first fine pattern unit includes the first surface which is perpendicular to the upper surface of the first fine pattern unit and the second surface which is inclined at a predetermined angle with respect to the first surface. The side surface of the second fine pattern unit includes the first surface which is perpendicular to the upper surface of the second fine pattern unit and the second surface which is inclined at a predetermined angle with respect to the first surface. Thus, a seam line at an abutment surface of the first fine pattern unit and the second fine pattern unit can be minimized.

In addition, the supporting part may prevent deformation and movement of the first and second fine pattern units. Thus, quality of the imprint master template may be maintained.

In addition, the adhesive may form the convex portion on the upper surface of the imprint master template. Accordingly, the seam can be minimized, and quality of the imprint pattern may be improved.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
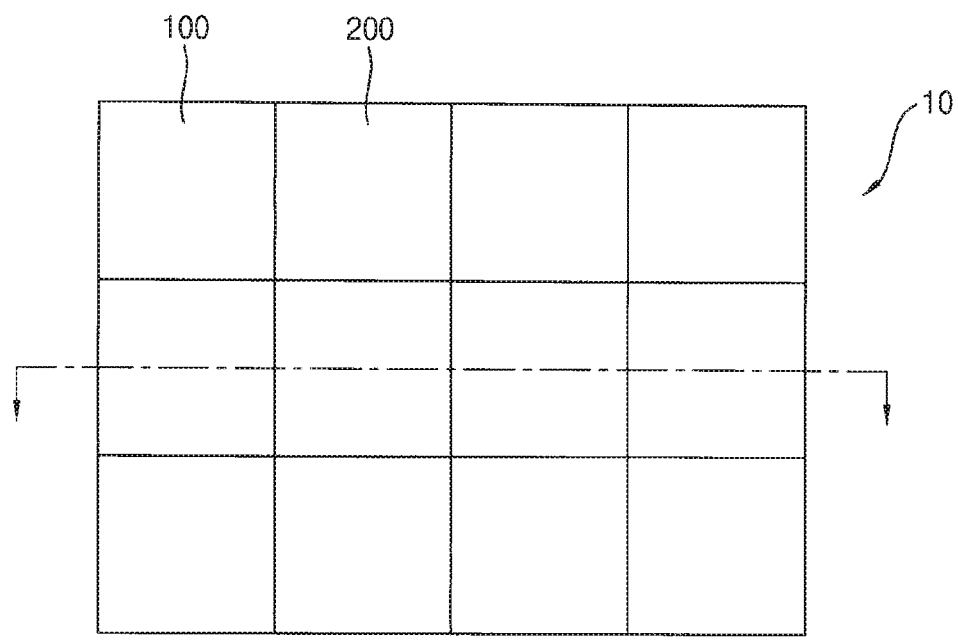
FIG. 1 is a plan view illustrating an imprint master template according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the inventive concept will be explained in detail with reference to the accompanying drawings.

Figure 2:
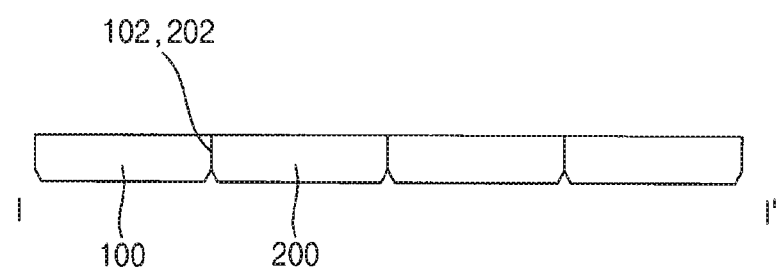
FIG. 2 is a cross-sectional view taken along a line I-I' of FIG. 1.

FIG. 1 is a plan view illustrating an imprint master template according to an exemplary embodiment of the inventive concept. FIG. 2 is a cross-sectional view taken along a line I-I' of FIG. 1.

Referring to FIGS. 1 and 2, the imprint master template 10 may include a plurality of fine pattern units 100, 200 arranged in a matrix form. In the present exemplary embodiment, the fine pattern units 100, 200 may be arranged in a 4*3 matrix form. The imprint master template 10 may be expanded by arranging a plurality of fine pattern units 100,

200 each having regular size. One fine pattern unit may be formed by one wafer. Thus, the one fine pattern unit should be smaller than one wafer. However, the imprint master template 10 includes a plurality of the fine pattern units 100, 200, so that the imprint master template 10 may be larger than a traditional wafer.

The fine pattern units may include a first fine pattern unit 100 and a second fine pattern unit 200 adjacent to the first fine pattern unit 100. A fine pattern 110, 210 may be formed by being protruded from an upper surface of each of the fine pattern units 100, 200. The configuration of the first and second fine pattern units 100 and 200 will be described in detail with reference to FIGS. 3A to 3G.

A first surface 102 of side surfaces of the first fine pattern unit 100 may be disposed to face a first surface 202 of side surfaces of the second fine pattern unit 200. The first surface 102 of the first fine pattern unit 100 and the first surface 202 of the second fine pattern unit 200 may be attached to each other by an adhesive 300, as shown in FIG. 3F, disposed between the first surface 102 and the first surface 202.

FIGS. 3A to 3G are cross-sectional views illustrating a method of manufacturing an imprint master template according to an exemplary embodiment of the inventive concept.

Figure 3A:
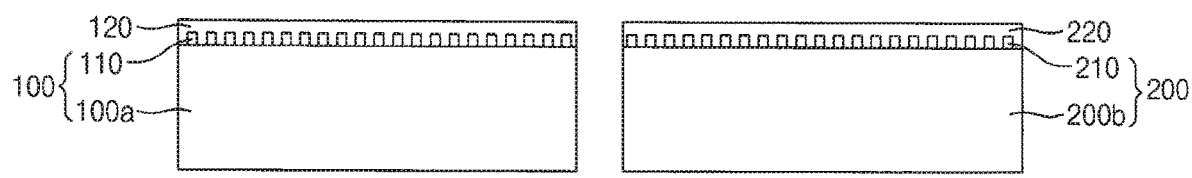
FIG. 3A.

Referring to FIG. 3A, a first fine pattern unit 100 having a fine pattern 110 protruded from an upper surface of a first wafer substrate 100a and a second fine pattern unit 200 having a fine pattern 210 protruded from an upper surface of a second wafer substrate 200a may be provided. The first fine pattern unit 100 and the second fine pattern unit 200 may have substantially the same arrangement.

The first fine pattern unit 100 may be formed by processing a traditional silicon (Si) wafer. The fine pattern 110 may be a fine pattern for forming a wire grid polarizer. For example, the fine pattern 110 may be a wire grid pattern including a plurality of protrusions spaced at regular intervals and extending in a specific direction, and the wire grid pattern may have a pitch about 50 nm (nanometers) to 150 nm. The pitch may be defined as a sum of a width of one of the protrusion and a distance between the protrusions disposed adjacent to each other.

A protection layer 120 may be formed on the first fine pattern unit 100. The protection layer 120 may prevent damage to the fine pattern 110 during the following process. The protection layer 120 may be formed by coating and hardening a photoresist material. However, the inventive concept is not limited thereto. The protection layer 120 may be any substance that can protect the fine pattern 110 and be removed without damaging the fine pattern 110.

A protection layer 220 may also be formed on the second fine pattern unit 200.

Figure 3B:
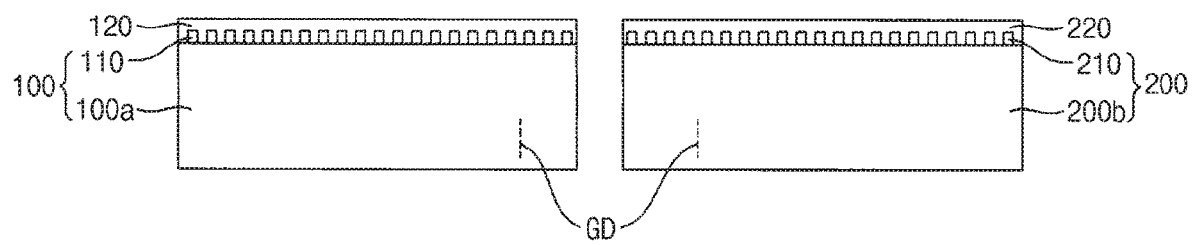
FIG. 3B.

Referring to FIG. 3B, a cutting line guide GD may be formed at an edge of the first wafer substrate 100a. The cutting line guide GD may guide a cutting line when the first wafer substrate 100a is cut. For example, the cutting line guide GD may be formed by stealth dicing process and the like. According to the process, laser is irradiated to the first wafer substrate 100a, and then reformed area may be formed inside of the first wafer substrate 100a, so that the reformed area may be the cutting line guide GD.

In addition, according to another exemplary embodiment, the cutting line guide may be a groove formed at a portion of the first wafer substrate 100a. The groove may be formed by a laser dicing process, a diamond saw dicing process, a water jet dicing process, or a BORSCH process, which repeats etching and forming a polymer layer, etc.

Here, the cutting line guide GD may be formed at a lower portion of the first wafer substrate 100a. The cutting line guide GD is formed at the lower portion of the first wafer substrate 100a, and is not formed at an upper portion of the wafer substrate 100 in a cross-sectional view.

Figure 3C:
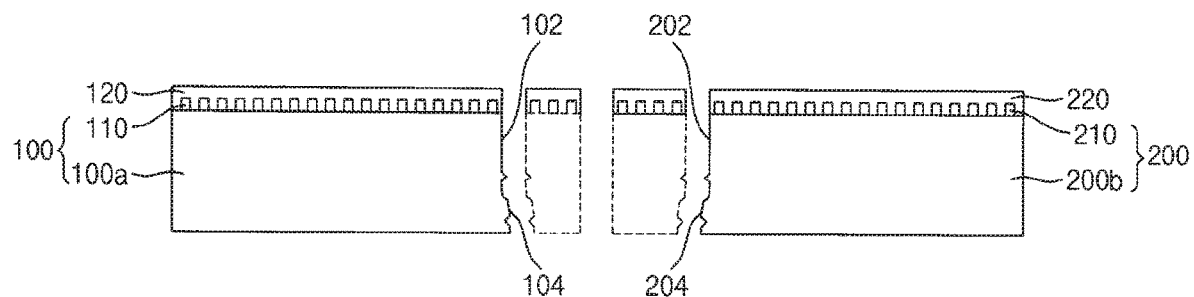
FIG. 3C.

Referring to FIG. 3C, the first wafer substrate 100a may be cut along the cutting line guide GD by a cleaving process and the like. Accordingly, a cut surface may be formed at a side surface of the first wafer substrate 100a. The cut surface may include a first surface 102 and a preliminary second surface 104. The first surface 102 may be a crystal face which is formed by cutting along a crystal plane of silicon (Si) of first wafer substrate 100a by the cleaving process. The first surface 102 may be perpendicular to an upper surface of the first wafer substrate 100a.

The preliminary second surface 104 may be a portion where the cutting line guide GD was formed. The preliminary second surface 104 may be an amorphous face, which is formed by cutting amorphous silicon. Thus, the roughness of the first surface 102 may be much less than the roughness of the preliminary second surface 104.

The second fine pattern unit 200 may be cut in a same manner, so that the second fine pattern unit 200 including a cut surface having a first surface 202, and a preliminary second surface 204 may be formed.

Figure 3D:
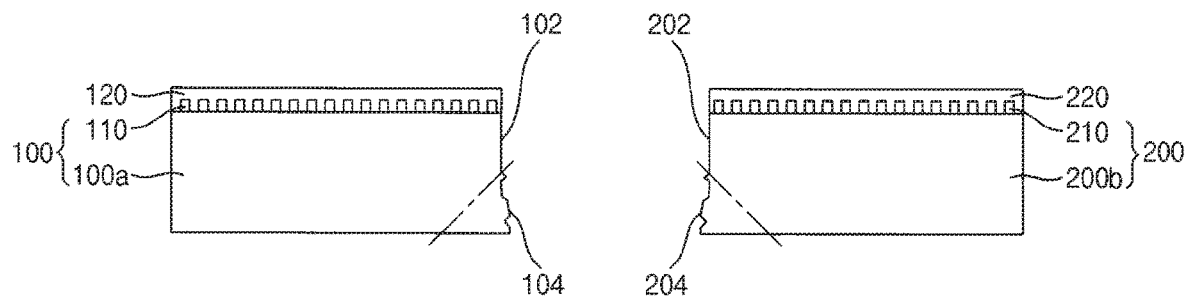
FIG. 3D.
Figure 3E:
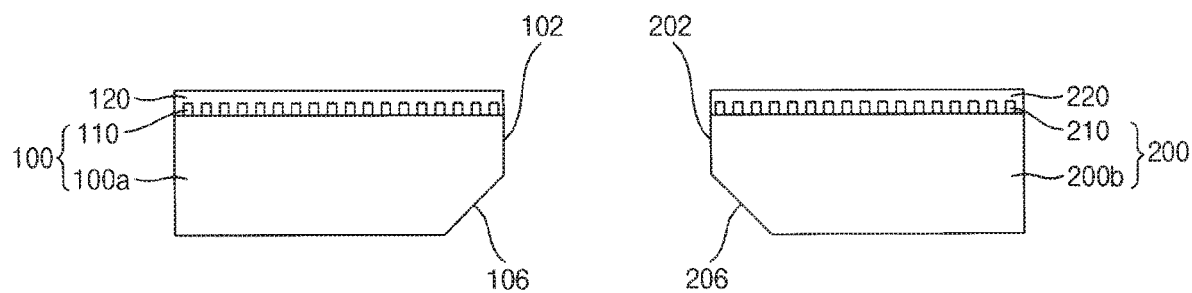
FIG. 3E.
Figure 3F:
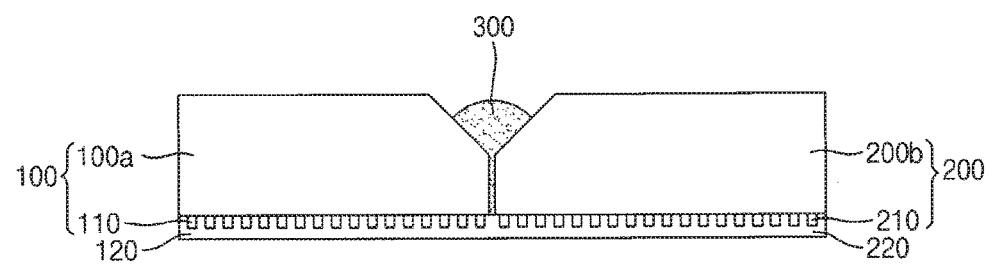
FIG. 3F.

Referring to FIGS. 3D and 3E, the preliminary second surface 104 of the first wafer substrate 100a of the first fine pattern unit may be polished to form a second surface 106. The second surface 106 may formed to be inclined at a predetermined angle with respect to the first surface 102. Surfaces of the preliminary second surface 104, which has relatively greater roughness, may be polished, and the second surface 106, which is inclined at a predetermined angle with respect to the first surface 102, is formed. Thus, when the first surface 102 of the first fine pattern unit 100 and the first surface 202 of the second fine pattern unit 200 are disposed to face each other, a gap between the first fine pattern unit 100 and the second fine pattern unit 200 may be minimized. Accordingly, the size of a seam formed by the gap between the first fine pattern unit 100 and the second fine pattern unit 200 can be minimized.

The preliminary second surface 204 of the second fine pattern unit 200 may also be polished to form a second surface 206.

Referring to FIG. 3F, the first fine pattern unit 100 and the second fine pattern unit 200 may be bonded to each other with the first surface 102 of the first fine pattern unit 100 and the first surface 202 of the second fine pattern unit 200 facing each other.

After locating the fine patterns 110, 210 of the first and second fine pattern units 100, 200 to face the ground (the upper surface of the first and second fine pattern units 100, 200 heads to the ground), an adhesive may be provided between the first surface 102 of the first fine pattern unit 100 and the first surface 202 of the second fine pattern unit 200. Thus, the first fine pattern unit 100 and the second fine pattern unit 200 may be bonded to each other.

The protection layers 120, 220 are formed on the fine patterns 110, 210, so that damage to the fine patterns 110, 210 may be prevented. In addition, the fine patterns 110, 210 are oriented to face the ground, so that the fine patterns 110, 210 can be located in a same plane, when the first fine pattern unit 100 and the second fine pattern unit 200 are bonded to each other.

The adhesive 300 may be a solder including aluminum, but the inventive concept is not limited thereto. The adhesive 300 may be a material that can adhere the first fine pattern unit 100 to the second fine pattern unit 200. The adhesive 300 may be an adhesive including an epoxy resin, an imide resin, an amide resin, a silicone resin, and an acrylate resin.

The adhesive 300 may be ideally provided up to the same height as the upper surfaces of the first and second wafer substrates 100 and 200, so that it may be desirable that the adhesive 300 does not affect the fine patterns 110 and 210. However, it is difficult to precisely control the degree to which the adhesive 300 is provided in the manufacturing process. In addition, the adhesive 300 may be further provided on the upper surface of the first and second wafer substrates 100 and 200, and a convex portion (See FIG. 4A) may be formed on the upper surface. A detailed description thereof will be described later with reference to FIGS. 4A to 4C.

Figure 3G:
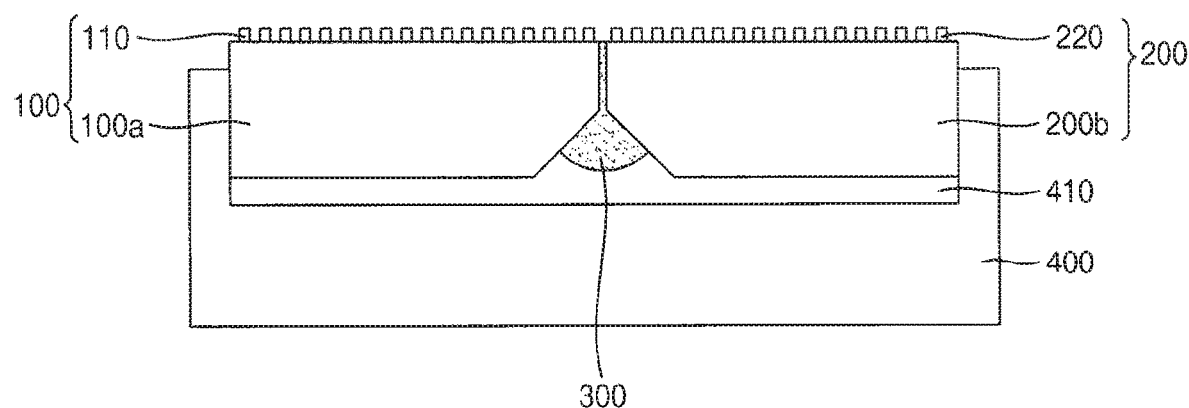
FIG. 3G are cross-sectional views illustrating a method of manufacturing an imprint master template according to an exemplary embodiment of the inventive concept.

Referring to FIG. 3G, a supporting part 400 supporting the first fine pattern unit 100 and the second fine pattern unit 200 may be formed.

The supporting part 400 may be attached on a lower surface of the first and second fine pattern units 100, 200 to fix the first and second fine pattern units 100, 200. An adhesive layer 410 may be further formed between the supporting part 400 and the first and second fine pattern units 100, 200.

The supporting part 400 may include a side wall 410 which covers side surface of the first fine pattern unit 100 and side surface of the second fine pattern unit 200. The supporting part 400 may be a rigid body which is not deformed by external force. For example, the supporting part 400 may be formed of metal or ceramic to prevent deformation or movement of the first and second fine pattern units 100, 200.

The supporting part 400 may have various shapes and structures. A detailed description thereof will be described later with reference to FIGS. 6A to 6C.

Figure 4A:
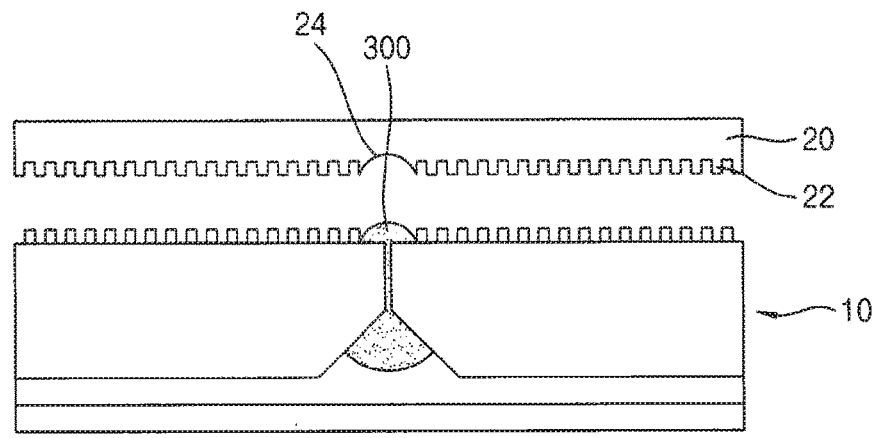
FIG. 4A.
Figure 4B:
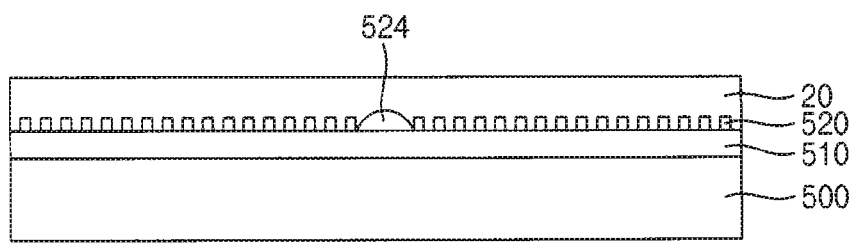
FIG. 4B.
Figure 4C:
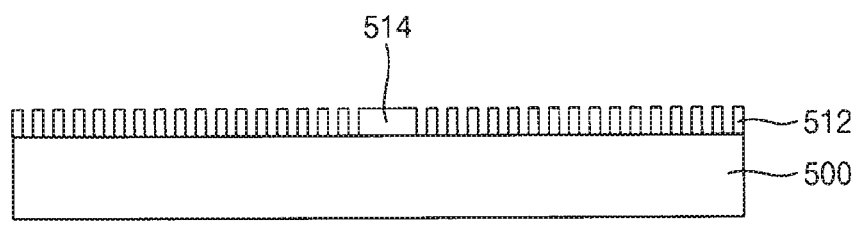
FIG. 4C are cross-sectional views illustrating a method of forming an imprint resist pattern using an imprint master template according to an exemplary embodiment of the inventive concept.

FIGS. 4A to 4C are cross-sectional views illustrating a method of forming an imprint resist pattern using an imprint master template according to an exemplary embodiment of the inventive concept.

Referring to FIG. 4A, an imprint stamp may be formed using the imprint master template 10.

An imprint pattern 22 may be formed on an imprint resin layer 20 by imprinting a fine pattern of the imprint master template 10 to the imprint resin layer 20. Accordingly, the imprint stamp on which the imprint pattern 22 is formed may be formed.

For example, an imprint resin solution is coated on a substrate, and then the imprint resin solution is pressed by the imprint master template 10, and then the imprint resin solution is hardened, and then the hardened resin layer is separated from the imprint master template 10. Accordingly, the imprint stamp may be formed.

Here, an adhesive 300 between a first fine pattern unit 100 and a second fine pattern unit 200 of the imprint master template 10 may have a convex portion protruded from an upper surface of the imprint master template 10. Accordingly, the imprint stamp may have a concave portion 24 formed at a seam which is a boundary of the first fine pattern unit 100 and the second fine pattern unit 200.

Referring to FIG. 4B, an imprint resist pattern 520 may be formed by using the imprint stamp.

For example, a first layer 510 may be formed on a substrate 500. The first layer 510 may be a metal layer for forming a wire grid polarizer (WGP). For example, the first layer 510 may include aluminum.

An imprint resin solution is coated on the first layer 510; the imprint resin solution is pressed by the imprint stamp; the imprint resin solution is hardened; and then the imprint stamp is separated from the hardened resin layer. Accordingly, the imprint resist pattern 520 may be formed. A process for removing residual layer of the imprint resist pattern 520 may be further performed if necessary.

Here, corresponding to the concave portion 24 of the imprint stamp, an error pattern 524 of the imprint resist pattern 520 may be formed. The error pattern 524 may be formed corresponding to the seam of the imprint master template 10, and the error pattern 524 which is a convex pattern may be formed due to the convex portion of the adhesive 300.

Referring to FIG. 4C, a first layer pattern 512 may be formed by patterning the first layer 510 using the imprint resist pattern 520. The first layer pattern 512 may be a wire grid polarizer.

Here, a seam pattern 514 may be formed corresponding to the seam due to the error pattern 524. The seam pattern 514 may be a portion where the first layer 510 is not patterned that is, so called, a black seam.

When the adhesive 300 forms the convex portion, the black seam is formed corresponding to the seam as described in FIG. 4C. In contrast to this, when the adhesive 300 is insufficiently supplied and a concave portion is formed (refer to FIG. 5A to 5C), a white seam is formed. Generally, an error pattern of the white seam is larger than that of the black seam. Thus, optical performance of the wire grid polarizer having the white seam is degraded as compared to the wire grid polarizer having the black seam.

Figure 5A:
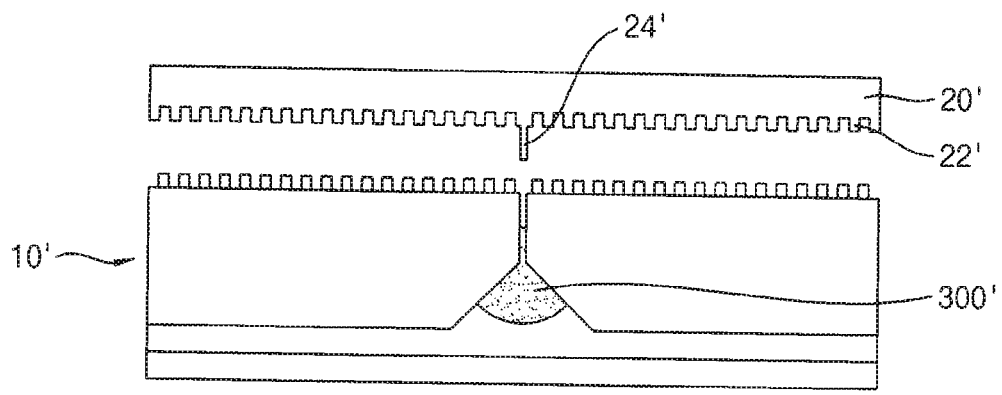
FIG. 5A.
Figure 5B:
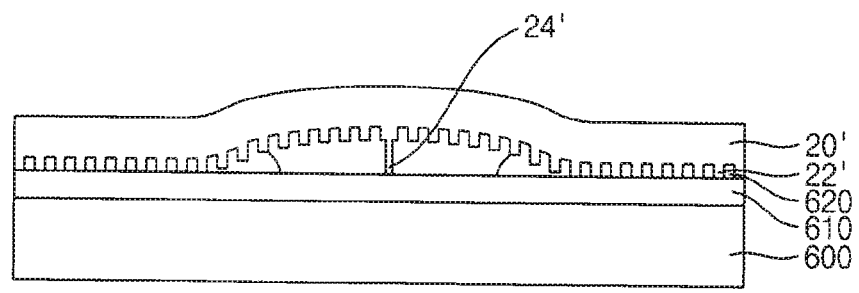
FIG. 5B.
Figure 5C:
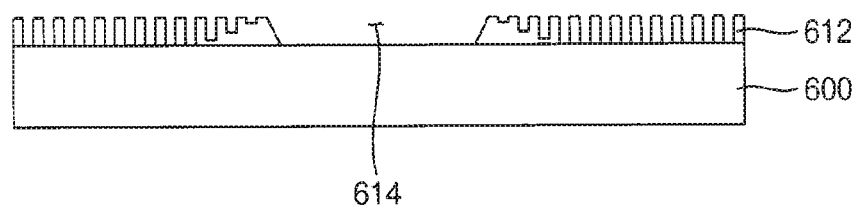
FIG. 5C are cross-sectional views illustrating a method of forming an imprint resist pattern using an imprint master template according to a comparative example.

FIGS. 5A to 5C are cross-sectional views illustrating a method of forming an imprint resist pattern using an imprint master template according to a comparative example.

Referring to FIG. 5A, an imprint stamp may be formed using an imprint master template 10' according to the comparative example.

An imprint pattern 22' may be formed on an imprint resin later 20' by imprinting a fine pattern of the imprint master template 10' to the imprint resin later 20'. Accordingly, the imprint stamp on which the imprint pattern 22' is formed may be formed.

Here, an adhesive 300' of the imprint master template 10' according to the comparative example is not sufficiently provided up to an upper surface of the imprint master template 10', so that a concave portion is formed on the upper surface.

Accordingly, the imprint stamp may have a convex portion 24' formed at a seam which is a boundary of the first fine pattern unit 100 and the second fine pattern unit 200.

Referring to FIG. 5B, an imprint resist pattern 620 may be formed by using the imprint stamp.

Here, corresponding to the convex portion 24' of the imprint stamp, an error pattern of the imprint resist pattern 620 may be formed. The error pattern may be formed corresponding to the seam of the imprint master template 10'. It is hard to make contact the imprint stamp to the resin layer, so that the imprint pattern 22' is not imprinted to the resin layer. Thus, the error pattern may be formed corresponding to the seam of the imprint master template 10'.

Referring to FIG. 5C, a first layer pattern 612 may be formed by patterning a first layer 610 using the imprint resist pattern 620. The first layer pattern 612 may be a wire grid polarizer.

Here, a seam pattern 614 may be formed corresponding to the seam due to the error pattern. The seam pattern 614 may be a portion where the first layer 610 is not patterned that is, so called, a white seam.

For the comparative example, the error pattern is larger than the error pattern of the present exemplary embodiment. Thus, optical performance of the wire grid polarizer according to the comparative example is degraded.

Accordingly, it is advantageous that the adhesive of the imprint master template is provided sufficiently to form a protrusion on the upper surface.

Figure 6A:
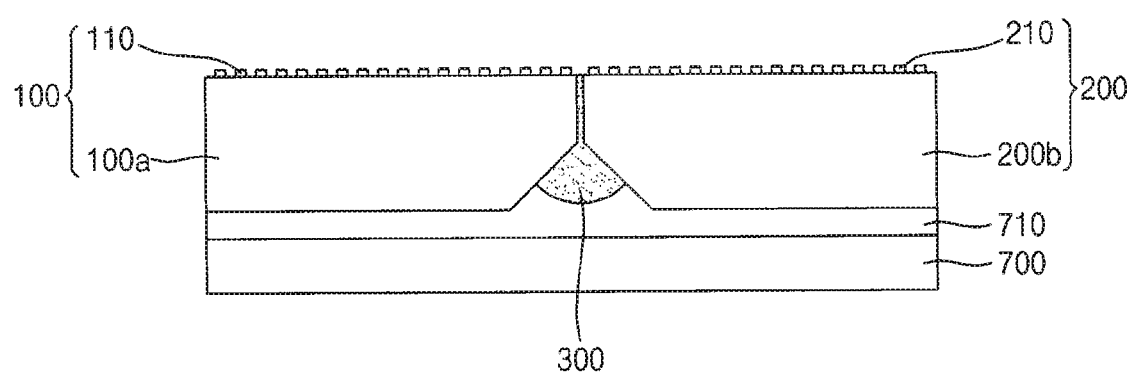
FIG. 6A.
Figure 6B:
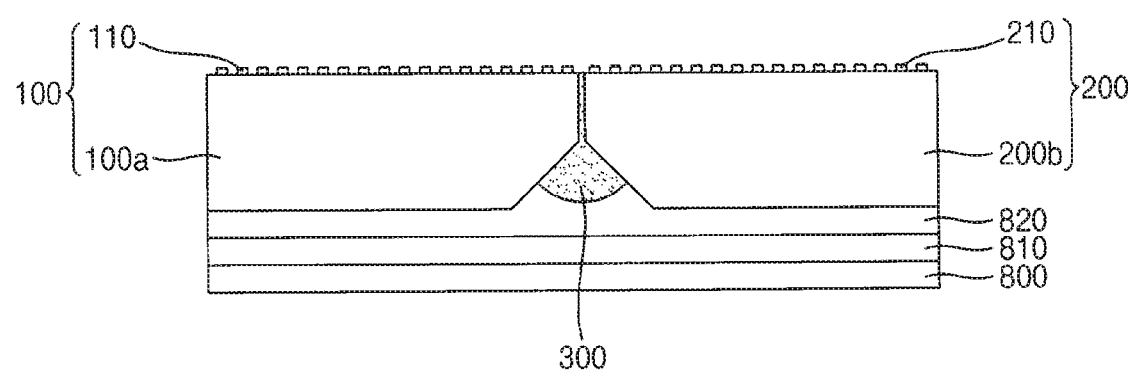
FIG. 6B.
Figure 6C:
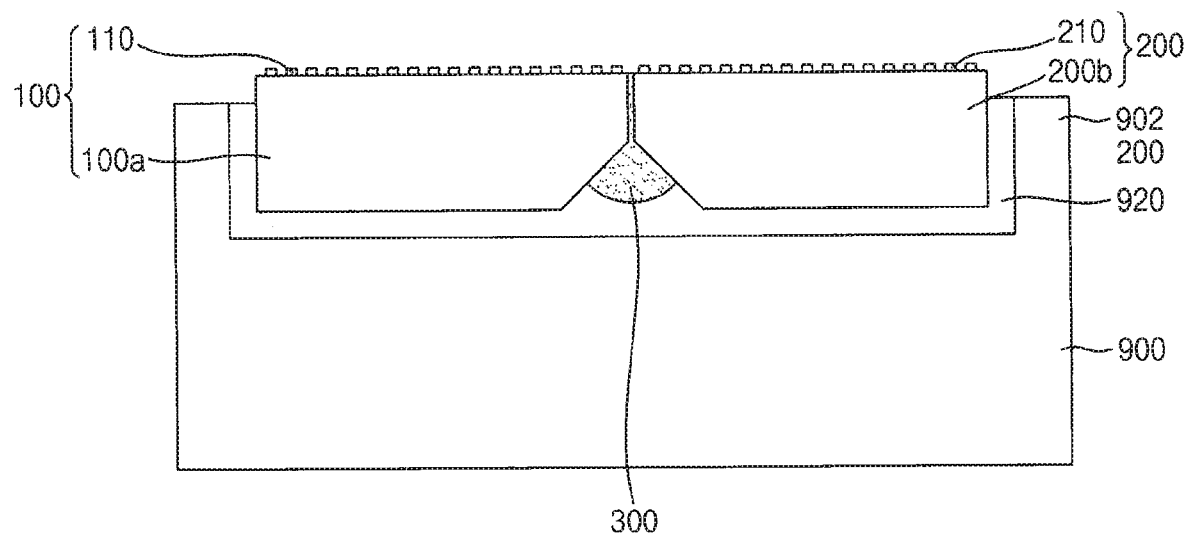
FIG. 6C are cross-sectional views illustrating imprint master templates according to exemplary embodiments of the inventive concept.

FIGS. 6A to 6C are cross-sectional views illustrating imprint master templates according to exemplary embodiments of the inventive concept.

Referring to FIG. 6a, the imprint master template may include first and second fine pattern units 100, 200 and a supporting part configured to support the first and second fine pattern unit. The supporting part may include an adhesive layer 710 and a substrate 700.

A first wafer substrate 100a of the first fine pattern unit 100 and a second wafer substrate 200a of the second fine pattern unit 200 may be bonded to each other by an adhesive 300. The first wafer substrate 100a and the second wafer substrate 200a may be supported by the substrate 700. The adhesive layer 710 may be formed between the substrate 700 and the first and second wafer substrate 100 and 200 to fix the first and second wafer substrate 100 and 200 to the substrate 700.

The substrate 700 may have enough strength to support and fix the first and second wafer substrates 100, 200. For example, the substrate 700 may be formed of glass substrate, quartz substrate, resin substrate, and etc.

Referring to FIG. 6B, an imprint master template may include first and second fine pattern units 100, 200 and a supporting part configured to support the first and second fine pattern units. The supporting part may include an adhesive layer 820, a first layer 800 and a second layer 810.

A first wafer substrate 100a of the first fine pattern unit 100 and a second wafer substrate 200a of the second fine pattern unit 200 may be bonded to each other by an adhesive 300. The first wafer substrate 100a and the second wafer substrate 200a may be supported by the first and second layers 800 and 810. The adhesive layer 820 may be formed between the second layer 810 and the first and second wafer substrates 100 and 200.

The first layer 800 and the second layer 810 make contact with each other, so that the first layer 800 and the second layer 810 are stick together without an additional adhesive by a friction force. In addition, the first layer 800 and the second layer 810 may be bonded by an adhesive.

Each of the first and second layers 800 and 810 may be substrate or film, but it is not limited thereto. The first and second layers 800 and 810 may be anything that supports the first and second wafer substrates 100a and 200a.

The imprint master template according to the present exemplary embodiment includes the first and second layers 810 and 820 which are stacked, but it is not limited thereto. Any structure including plurality of laminated layers will be possible so as to be resistant to bending deformation.

Referring to FIG. 6C, an imprint master template may include first and second fine pattern units 100, 200 and a supporting part configured to support the first and second fine pattern units 100, 200.

A first wafer substrate 100a of the first fine pattern unit 100 and a second wafer substrate 200a of the second fine pattern unit 200 may be bonded to each other by an adhesive 300. The first wafer substrate 100a and the second wafer substrate 200a may be supported by the supporting part.

The supporting part may include an adhesive layers 920, a body 900, and a side wall 902. The body 900 may support the first and second fine pattern units 100, 200. The side wall 902 may be protruded from the body 900 and cover side surfaces of the first and second fine pattern units 100, 200. The supporting part may be a rigid body which is not deformed by external force. For example, the supporting part may be formed of metal or ceramic to firmly support the first and second wafer substrates 100.

According to the present exemplary embodiments, the imprint master template includes the first fine pattern unit 100 on which the first fine pattern 110 is formed, the second fine pattern unit 200 disposed adjacent to the first fine pattern unit 100 and on which the second fine pattern 210 is formed, and a supporting part for supporting the first fine pattern unit 100 and the second fine pattern unit 200. The side surface of the first fine pattern unit 100 faces the side surface of the second fine pattern unit 200, and the side surface of the first fine pattern unit 100 includes the first surface which is perpendicular to the upper surface of the first fine pattern unit 100 and the second surface which is inclined at a predetermined angle with respect to the first surface. The side surface of the second fine pattern unit 200 includes the first surface, which is perpendicular to the upper surface of the second fine pattern unit 200 and the second surface which is inclined at a predetermined angle with respect to the first surface. Thus, a seam line at an abutment surface of the first fine pattern unit 100 and the second fine pattern unit 200 can be minimized.

In addition, the supporting part may prevent deformation and movement of the first and second fine pattern units 100, 200. Thus, quality of the imprint master template may be maintained.

In addition, the adhesive may form the convex portion on the upper surface of the imprint master template. Accordingly, the seam can be minimized, and quality of the imprint pattern may be improved.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an imprint master template, comprising:
   forming a first cutting line guide at an edge of a first fine pattern unit having an upper surface on which a first fine pattern is formed;
   forming a second cutting line guide at an edge of a second fine pattern unit having an upper surface on which a second fine pattern is formed;
   cutting a wafer substrate by a cleaving process along the first and second cutting line guides, so that a cutting surface is formed on each of the first and second fine pattern units, the cutting surface having a preliminary second surface where each of the first and second cutting line guides were formed and a first surface which is formed by the cleaving process;
   polishing the preliminary second surface to form a second surface which is inclined at a predetermined angle with respect to the first surface;
   bonding the first fine pattern unit and the second fine pattern unit to each other with the first surface of the first fine pattern unit facing the first surface of the second fine pattern unit; and
   forming a supporting part which supports the first fine pattern unit and the second fine pattern unit.

2. The method of claim 1, further comprising forming a protection layer on the first and second fine patterns.

3. The method of claim 2, wherein the forming the first cutting line guide and the forming the second cutting line guide each further comprises irradiating a laser to the wafer substrate to form a reformed area inside of the wafer substrate.

4. The method of claim 3, wherein the first surface is perpendicular to the upper surface of the first fine pattern unit, and is a crystal face.

5. The method of claim 1, wherein:
the upper surfaces of the first and second fine pattern units are disposed to face the ground; and
the bonding of the first fine pattern unit and the second fine pattern unit to each other further comprises providing an adhesive between the first and second surfaces of the first fine pattern unit and the first and second surfaces of the second fine pattern unit.

6. The method of claim 5, wherein the adhesive is solder comprising aluminum.

7. The method of claim 5, wherein the adhesive is formed at a level higher than the upper surfaces of the first and second fine pattern units, and is configured to form a convex portion on the upper surfaces.

8. The method of claim 1, wherein the supporting part is formed by laminating a plurality of layers.

9. The method of claim 1, further comprising forming an adhesive layer between the supporting part and the first and second fine pattern units,
wherein the supporting part comprises a side wall configured to cover side surfaces at least one of the first and second fine pattern units, and comprises a rigid body which is not deformed by external force.

10. The method of claim 1, wherein:
each of the first and second cutting line guides comprises a groove formed on a portion of the wafer substrate; and
the forming a first cutting line guide and the forming a second cutting line guide each further comprises forming the groove by one of a diamond saw dicing process, a water jet dicing process, and a BORSCH process.

* * * * *